(12) United States Patent
Gipson et al.

(10) Patent No.: US 10,688,916 B2
(45) Date of Patent: Jun. 23, 2020

(54) MULTIPLE RESIN OVER-MOLD FOR PRINTED CIRCUIT BOARD ELECTRONICS AND LIGHT GUIDE

(71) Applicant: Dura Operating, LLC, Auburn Hills, MI (US)

(72) Inventors: Ron G. Gipson, Metamora, MI (US); Bhanumurthy Veeragandham, Auburn Hills, MI (US); Indraneel Page, Farmington Hills, MI (US)

(73) Assignee: DURA OPERATING, LLC, Auburn Hills, MI (US)

( * ) Notice: Subject to any disclaimer, the term of this patent is extended or adjusted under 35 U.S.C. 154(b) by 12 days.

(21) Appl. No.: 15/976,121

(22) Filed: May 10, 2018

(65) Prior Publication Data

US 2019/0344704 A1    Nov. 14, 2019

(51) Int. Cl.

| | |
|---|---|
| *F21S 4/00* | (2016.01) |
| *F21V 21/00* | (2006.01) |
| *B60Q 1/26* | (2006.01) |
| *F21V 19/00* | (2006.01) |
| *H05K 1/02* | (2006.01) |
| *H05K 1/14* | (2006.01) |
| *H05K 3/28* | (2006.01) |

(52) U.S. Cl.
CPC .......... *B60Q 1/2696* (2013.01); *F21V 19/001* (2013.01); *H05K 1/0298* (2013.01); *H05K 1/142* (2013.01); *H05K 3/284* (2013.01)

(58) Field of Classification Search
CPC .... B60Q 1/26–2696; F21V 19/00–045; H05K 1/00–0298; H05K 1/142; H05K 3/284

USPC .................................... 362/249.02, 311.02
See application file for complete search history.

(56) References Cited

U.S. PATENT DOCUMENTS

| | | |
|---|---|---|
| 9,485,870 B2 | 11/2016 | Mayo et al. |
| 2005/0000726 A1 | 1/2005 | Kimata et al. |
| 2009/0154182 A1 | 6/2009 | Veenstra et al. |
| 2016/0295702 A1 | 10/2016 | Heikkinen et al. |
| 2016/0345437 A1 | 11/2016 | Heikklnen et al. |

FOREIGN PATENT DOCUMENTS

| | | |
|---|---|---|
| GB | 908677 A | 10/1962 |
| WO | 2009075924 A1 | 6/2009 |
| WO | 2017077193 A1 | 5/2017 |
| WO | 2017178702 A1 | 10/2017 |
| WO | 2017178703 A1 | 10/2017 |
| WO | 2018100243 A2 | 6/2018 |

OTHER PUBLICATIONS

US Patent Application, First Named Inventor: Gipson, "Multiple Resin Over-Mold for Printed Circuit Board Electronics and Light Guide," filed on May 10, 2018.

*Primary Examiner* — Jason M Han
(74) *Attorney, Agent, or Firm* — Vivacqua Crane PLLC

(57) ABSTRACT

A laminated light guide and component carrier includes a polymeric material body having a first face. A light emitting diode is positioned on the first face. A connector is positioned on the first face. A through aperture is created in the body positioned proximate to the light emitting diode. A light guide of a light transmissive polymeric material is overmolded onto the first face proximate to and covering the light emitting diode and filling the through aperture, and omitted from the space envelope containing the connector. An opaque polymeric material coating layer is affixed onto the first face outside of the light guide.

27 Claims, 6 Drawing Sheets

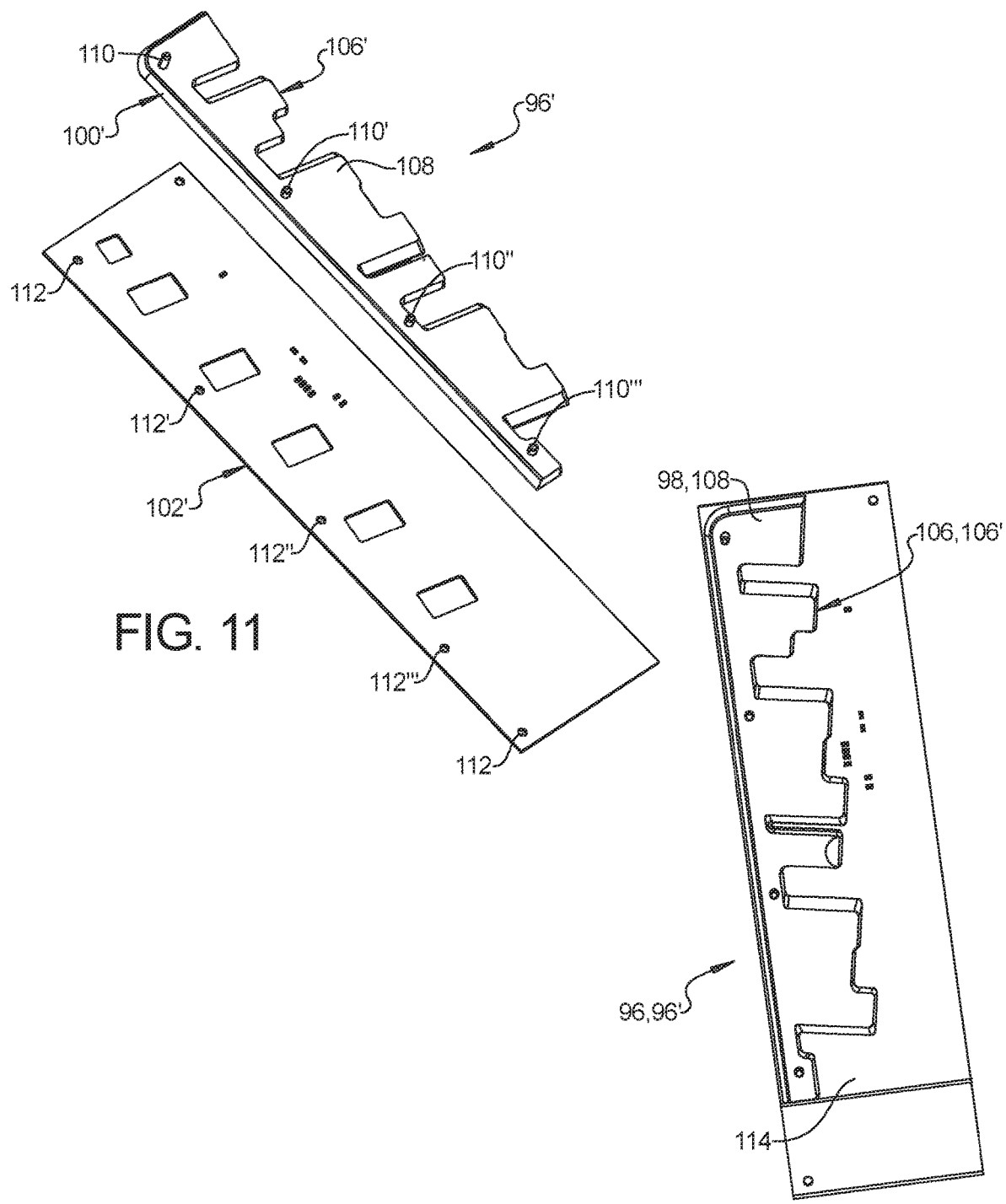

MULTIPLE RESIN OVER-MOLD FOR PRINTED CIRCUIT BOARD ELECTRONICS AND LIGHT GUIDE

FIELD

The present disclosure relates generally to printed circuit boards having at least one light generating component and a light guide.

BACKGROUND

The statements in this section merely provide background information related to the present disclosure and may or may not constitute prior art.

Electronic assemblies with backlit visual elements may be manufactured via several processes. Most commonly, a plastic part of a polymeric material resin is molded with some portion of the plastic being clear or translucent, with electronic components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronic components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, and then insert the formed film into an injection mold having substantially the same shape. A following step injection-molds plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronic components may also be printed onto a film. The film is then inserted into an injection mold, where plastic is molded onto the film, the electronic components being embedded in the molded plastic so that when the plastic part is removed from the mold the film is peeled away from the plastic part, leaving the electronic components embedded in or adhered to the surface of the plastic part.

Thus, while current printed film assemblies achieve their intended purpose, there is a need for a new and improved system and method for printing film assemblies having light emitting diodes encapsulated in a light guide.

SUMMARY

According to several aspects, a laminated light guide and component carrier includes a body having a first face. A light emitting diode is positioned on the first face. First electrical traces are printed on the first face with the light emitting diode connected to the first electrical traces. A connector is positioned on the first face also connected to the first electrical traces. A light guide of a light transmissive polymeric material is affixed onto the first face proximate to and covering the light emitting diode and omitted from the space envelope containing the connector. An opaque polymeric material coating layer is overmolded onto the first face outside of the light guide.

In another aspect of the present disclosure, the light guide is overmolded using a high pressure molding process.

In another aspect of the present disclosure, the light guide defines a poly-methyl methacrylate material.

In another aspect of the present disclosure, the opaque polymeric material coating layer is overmolded using a low pressure molding process.

In another aspect of the present disclosure, the opaque polymeric material coating layer has a coefficient of thermal expansion compatible with printed circuit board FR4 material.

In another aspect of the present disclosure, the light guide and the opaque polymeric material coating layer are each overmolded using a low pressure molding process.

In another aspect of the present disclosure, the light guide and the opaque polymeric material coating layer individually define a thermoplastic material heated to create a hot-melt prior to molding using the low pressure molding process.

In another aspect of the present disclosure, the connector includes capacitive touch film contacts provided within a space envelope of the connector, and second electrical traces are printed on a second face of the body oppositely directed with respect to the first face.

In another aspect of the present disclosure, capacitive touch circuits are printed on the second face of the body.

In another aspect of the present disclosure, capacitive touch second electrical traces connected to the capacitive touch circuits, wherein the capacitive touch second electrical traces are further connected by vias extending through the body to the connector positioned on the first face.

According to several aspects, a laminated light guide and component carrier includes a polymeric material body having a first face. A light emitting diode is positioned on the first face. A connector is positioned on the first face, the connector having multiple capacitive touch film contacts provided within a space envelope of the connector. A through aperture is created in the body positioned proximate to the light emitting diode. A light guide of a light transmissive polymeric material is affixed onto the first face proximate to and covering the light emitting diode and filling the through aperture, and omitted from the space envelope containing the connector. An opaque polymeric material coating layer is overmolded onto the first face outside of the light guide.

In another aspect of the present disclosure, first electrical traces are printed on the first face with the light emitting diodes each connected to the first electrical traces.

In another aspect of the present disclosure, capacitive touch circuits are printed on a second face of the body wherein the connector is also connected to the first electrical traces and the capacitive touch circuits.

In another aspect of the present disclosure, the light guide is applied using a high pressure molding process.

In another aspect of the present disclosure, the light guide is applied using a low pressure molding process.

In another aspect of the present disclosure, the light guide and the opaque polymeric material coating layer are each overmolded using a low pressure molding process, and each define a thermoplastic material heated to create a hot-melt prior to molding using the low pressure molding process.

In another aspect of the present disclosure, the light guide and the opaque polymeric material coating layer directly contact each other at a commonly facing edge of each of light guide and the opaque polymeric material coating layer; and the light guide and the opaque polymeric material coating layer have substantially a same thickness.

In another aspect of the present disclosure, multiple electronic components are mounted on the first face, and the light guide is omitted from covering the electronic components.

In another aspect of the present disclosure, the light guide includes a non-linear sawtooth-shaped face directed toward the electronic components.

In another aspect of the present disclosure, the light guide includes a pin frictionally received in an aperture created in the body to mechanically couple the light guide to the body.

According to several aspects, a laminated light guide and component carrier includes a polymeric material body having a first face and an oppositely directed second face. Multiple light emitting diodes are positioned on the first face. A connector is positioned on the first face, the connector having multiple capacitive touch film contacts provided within a space envelope of the connector. Multiple individual through apertures created in the body each positioned proximate to one of the light emitting diodes. A light guide of a light transmissive polymeric material is overmolded onto at least all of the light emitting diodes and filling each of the multiple individual through apertures, the light transmissive polymeric material omitted from the space envelope containing the connector. An opaque polymeric material coating layer is overmolded onto the first face outside of the light guide. A polymeric substantially opaque film is applied to the second face. Light generated by any of the light emitting diodes is blocked from passing through the opaque film except at individual locations of multiple indicia defining light transmissive portions of the opaque film each individually aligned with one of the through apertures.

In another aspect of the present disclosure, the light transmissive polymeric material of the light guide defines a poly-methyl methacrylate material overmolded using a high pressure molding process; and the opaque polymeric material coating layer defines a thermoplastic material overmolded using a low pressure molding process.

In another aspect of the present disclosure, the light guide and the opaque polymeric material coating layer are each overmolded using a low pressure molding process, and each define a thermoplastic material heated to create a hot-melt prior to molding using the low pressure molding process.

In another aspect of the present disclosure, multiple electronic components positioned on the first face and electrically connected to a plurality of first electrical traces printed onto the first face, the multiple electronic components and the first electrical traces covered by the opaque polymeric material coating layer.

In another aspect of the present disclosure, the light guide and the opaque polymeric material coating layer directly contact each other at a commonly facing first edge of light guide and a second edge of the opaque polymeric material coating layer, the first edge and the second edge oriented substantially perpendicular with respect to the body.

In another aspect of the present disclosure, the first edge is aligned with an electrical trace positioned on the first face of the body.

In another aspect of the present disclosure, the light guide and the opaque polymeric material coating layer have substantially a same thickness.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 11 is a top perspective assembly view of a laminated light guide and component carrier according to another embodiment; and FIG. 12 is a top perspective view of the laminated light guide and component carrier of FIG. 10 following addition of a low pressure molded portion.

DETAILED DESCRIPTION

The following description is merely exemplary in nature and is not intended to limit the present disclosure, application, or uses.

Figure 1:
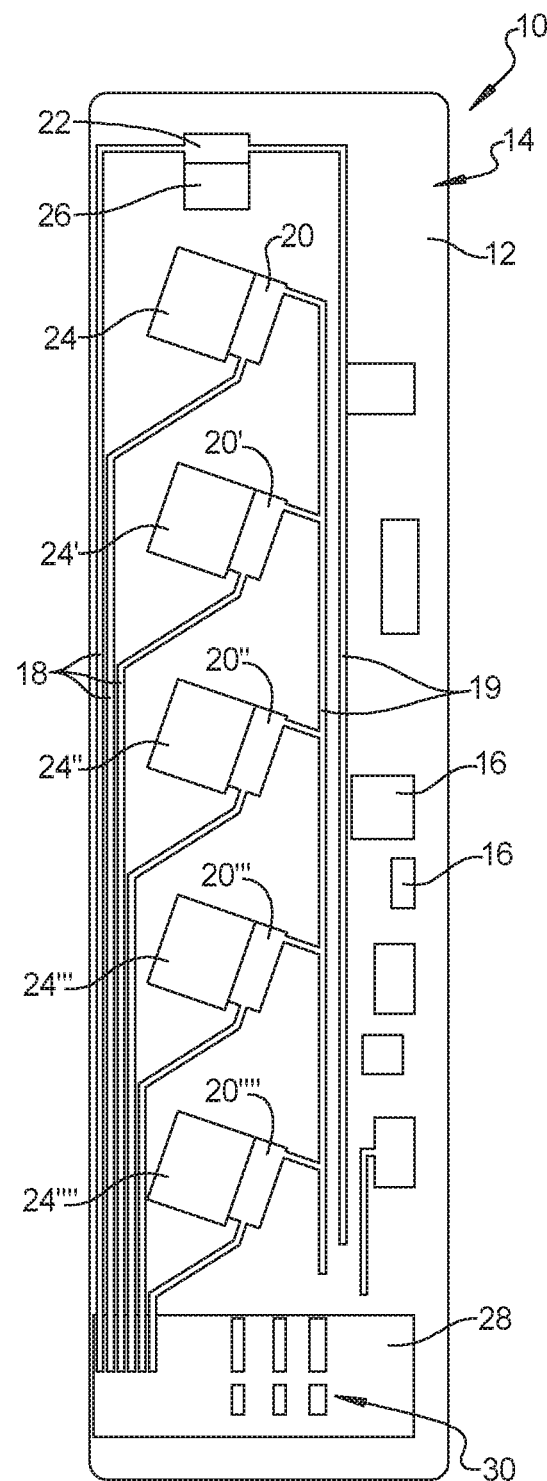
FIG. 1 is a top plan view of a laminated light guide and component carrier according to an exemplary embodiment.

Referring to FIG. 1, a laminated light guide and component carrier 10 includes a molded body 12 such as a printed circuit board having multiple electrical components mounted thereon. According to several aspects, the molded body 12 defines a rectangular shape, however any desired geometric shape may be used. On a first side or face 14 of the molded body 12 are located multiple electronic components 16 including capacitors, which are electrically connected to a plurality of first electrical traces 18, 19 printed for example by a screen printing process onto the first face 14. Multiple light emitting diodes 20, 20', 20", 20'", 20"" are also individually positioned on the first face 14 and connected to the electrical traces 18, 19. An additional light emitting diode 22 can optionally be provided at one end of the molded body 12 to provide an illuminated indication that electrical power is available for the laminated light guide and component carrier 10.

Positioned proximate to each of the light emitting diodes 20, 20' are multiple individual through apertures 24, 24', 24", 24'", 24"" created in the molded body 12. According to several aspects each of the through apertures 24, 24', 24", 24'", 24"" are square or rectangular shaped, however any geometry can be selected. A separate through aperture 26 may also be provided proximate to the light emitting diode 22, which is similar to the through apertures 24, 24', 24", 24'", 24"" in function, but may have a smaller cross section.

Also positioned on the first face 14 of the molded body 12 is a connector 28 which is connected to the electrical traces 18, 19. Multiple capacitive touch film contacts 30 are provided within a space envelope of the connector 28.

Figure 8:
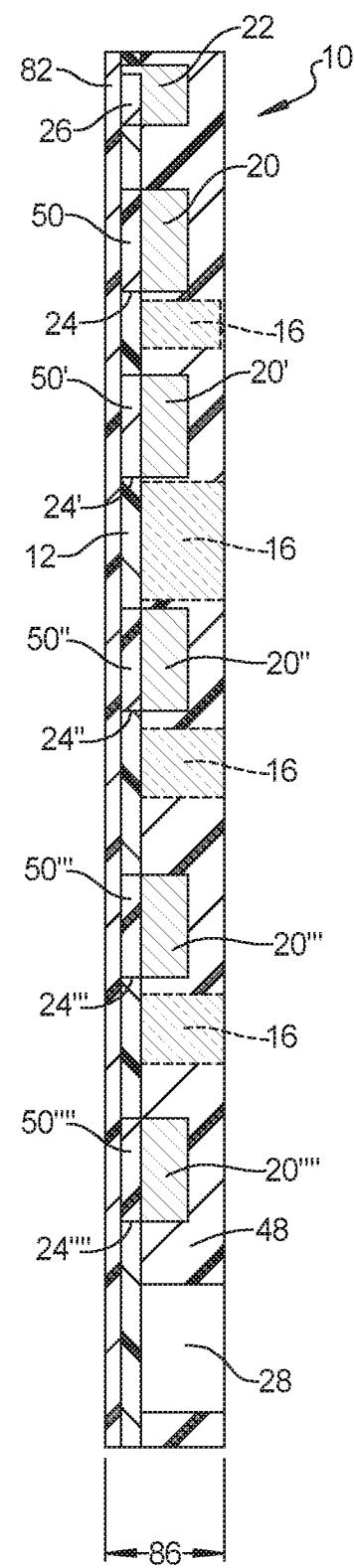
FIG. 8 is a cross sectional side elevational view taken at section 8 of FIG. 3.

Referring to FIG. 2 and again to FIG. 1, on an opposite second face 32 of the molded body 12 are printed capacitive touch circuits 34 which are connected to capacitive touch second electrical traces 36 and are further connected by apertures or vias extending through the molded body 12 to the connector 28 positioned on the first face 14 of the molded body 12. A capacitive touch sensor 38, 38', 38", 38''', 38'''' is also positioned proximate to each of the capacitive touch circuits 34, which are connected by electrical traces 39 to the connector 28. A window region 40, 40', 40", 40''', 40'''' unobstructed by direct through-passage of the electrical traces or the electrical components is maintained through the molded body 12 proximate to each of the capacitive touch sensors 38 and aligned with the through apertures 24, 24', 24", 24''', 24''''. Each window region 40, 40', 40", 40''', 40'''' permits light generated by one of the light emitting diodes 20, 20', 20", 20''', 20'''' and emitted through one of the through apertures 24, 24', 24", 24''', 24'''' to illuminate one of multiple indicia described in reference to FIG. 8. A separate window region 42 of the molded body 12 is also maintained through the molded body 12 to allow light generated by the light emitting diode 22 and emitted via the through aperture 26 to pass through a light guide 48 described in reference to FIG. 3.

Referring to FIG. 3 and again to FIG. 1, according to several aspects substantially the entire first side or face 14 of the molded body 12 is overmolded with an optically clear polymeric material such as poly-methyl methacrylate (PMMA) but is omitted at the area of the connector 28. The PMMA material is omitted at the area of the connector 28 to allow attachment of electrical wires such as from a vehicle cable to the connector 28 after molding in the area around and outside of the space envelope of the connector 28. As applied in the present disclosure, the term "optically clear" refers to a material having light transmissive properties in a clear or substantially clear cross section of the material. The polymeric material creates a light guide 48. The polymeric material of the light guide 48 such as PMMA also extends into, and completely fills each of the through apertures 24, 24', 24", 24''', 24'''', 26, which creates an individual light reflector 50, 50', 50", 50''', 50'''' in the through apertures 24, 24', 24", 24''', 24'''' and creates a light reflector 52 in the through aperture 26. Each of the light reflectors 50, 50', 50", 50''', 50'''', 52 can include an area of the light guide 48 having a "pebbled", texturally modified area or geometry proximate to each of the light emitting diodes 20, 20', 20", 20''', 20'''', 22. The light reflectors 50, 50', 50", 50''', 50'''', 52 are features of the light guide 48 itself created to locally enhance, reflect and scatter the light generated by the light emitting diodes 20, 20', 20", 20''', 20'''', 22 and are therefore formed as texturally modified areas of portions of the light guide 48.

Figure 2:
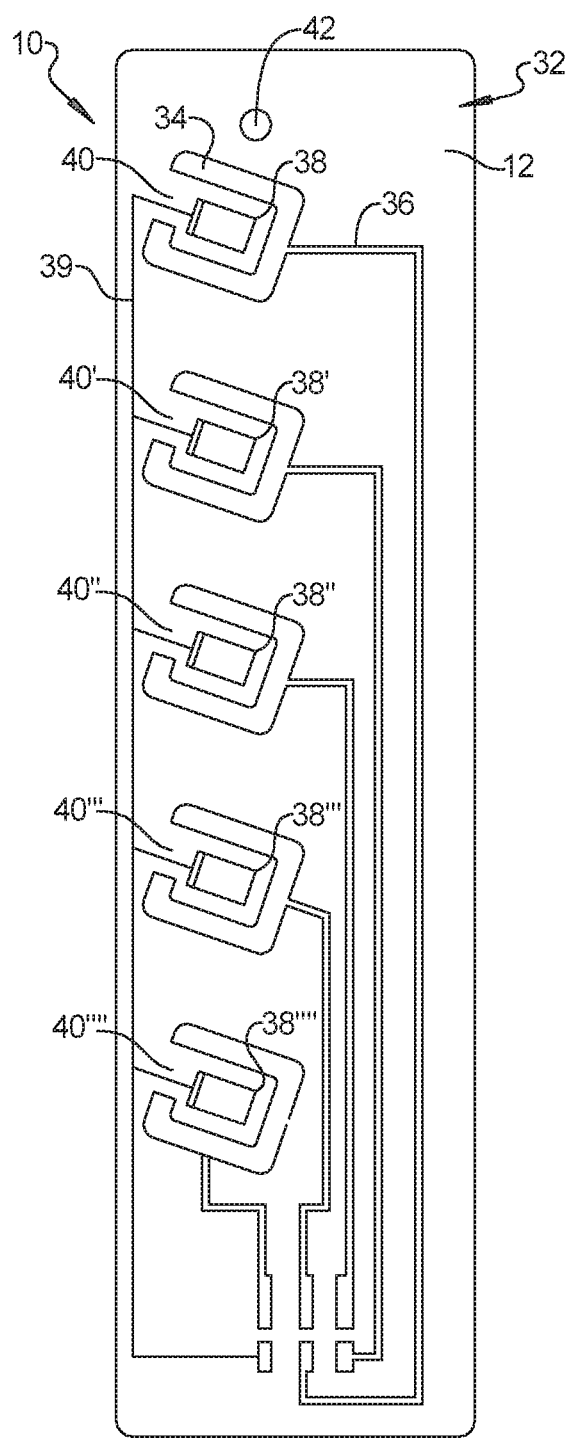
FIG. 2 is a bottom plan view of the laminated light guide and component carrier of FIG. 1.
Figure 3:
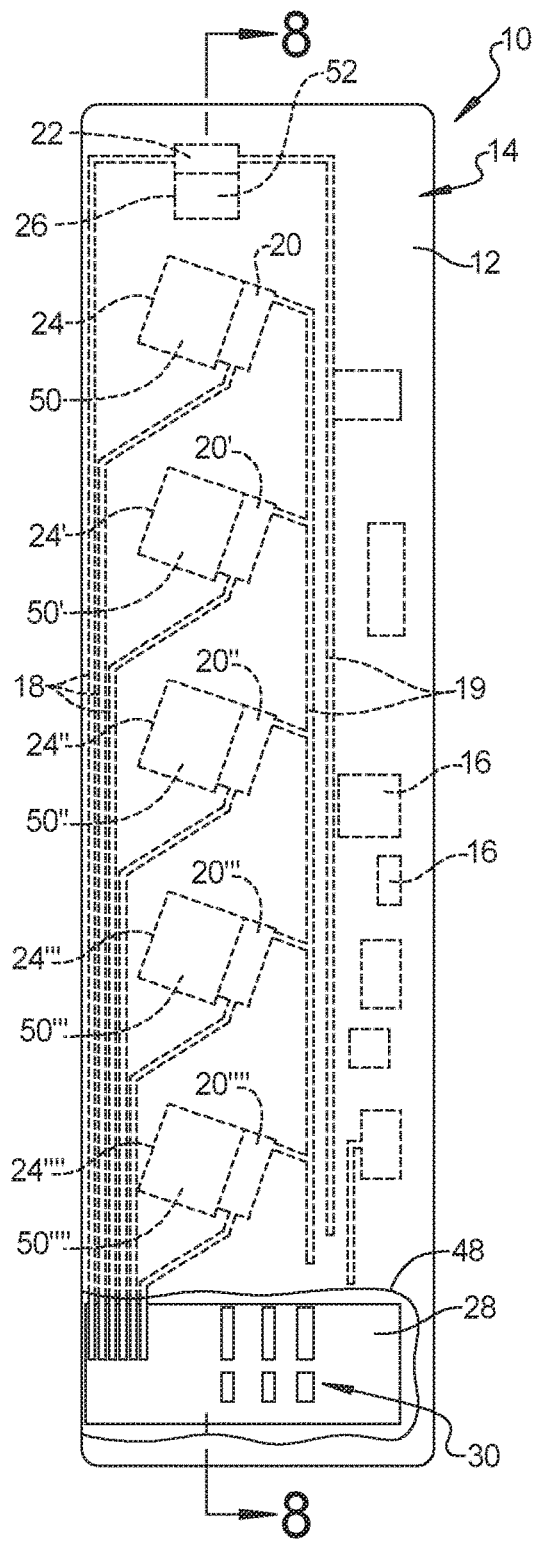
FIG. 3 is a top plan view modified from FIG. 1.

Referring to FIG. 4 and again to FIGS. 1 through 3, according to several aspects a laminated light guide and component carrier 54 is modified from the laminated light guide and component carrier 10. A portion of the first side or face 14 of the molded body 12 is overmolded with an optically clear first polymeric material such as poly-methyl methacrylate (PMMA) except at the multiple electronic components 16, the first electrical traces 18, 19 and at the area of the connector 28. The polymeric material creates a light guide 56. The polymeric material of the light guide 56 also extends into and fills each of the through apertures 24, 24', 24", 24''', 24'''', 26, which creates an individual light reflector 58, 58', 58", 58''', 58'''' in the through apertures 24, 24', 24", 24''', 24'''' and creates a light reflector 60 in the through aperture 26. Each of the light reflectors 58, 58', 58", 58''', 58'''', 60 can include an area of the light guide 56 having a "pebbled", texturally modified area or geometry proximate to each of the light emitting diodes 20, 20', 20", 20''', 20'''', 22.

Some of all of the remaining components and surface area of the first side or face 14 of the molded body 12 not covered by the light guide 56, including the multiple electronic components 16, and the first electrical traces 18, 19 and the area of the connector 28 are overmolded with a second, optionally opaque polymeric material such as a thermoplastic polyamide material applied using a low pressure injection molding (LPM) process to create a coating layer 62. According to several aspects, the LPM process uses a pressure lower than a higher pressure used to overmold the PMMA material. Using the LPM process, a thermoplastic material is heated until liquid (typically at 410 F/210 C). The hot liquid material defining a "hot melt" is then injected into a mold at very low pressure, typically ranging between approximately 50 to 200 psi (3.5 to 14 bar). According to several aspects, the material of the coating layer 62 may be a hot-melt adhesive such as Henkel Technomelt PA 6481 provided by the Henkel Corporation, Bridgewater, N.J. The LPM process applies heat to the thermoplastic polymeric material creating a "hot melt," in liquid form. The hot melt takes the form of a mold it is injected into, and encapsulates the multiple electronic components 16, the first electrical traces 18, 19 and the area of the connector 28. Optionally, the area around the connector 28 and the connector 28 itself may also be covered.

The second polymeric material liquefies at temperatures lower than PMMA material and can be injected using an injection pressure and temperature lower that for PMMA material, thereby enhancing encapsulation to take place without impacting the electronic components, and has a coefficient of thermal expansion which is "compatible" with an FR4 material of the molded body 12, defined as able to mechanically bond directly to the molded body 12 and thereafter move or deflect in unison with the molded body 12 without breaking the bond. FR4 material defines a grade designation assigned to glass-reinforced epoxy laminate sheets, tubes, rods and printed circuit boards (PCB). FR (flame retardant) 4 is a composite material of woven fiberglass cloth having an epoxy resin binder that is flame resistant, and complies with the standard UL94V-0. The coating layer 62 provides environmental protection for the multiple electronic components 16, and the first electrical traces 18, 19, and optionally the area of the connector 28.

Figure 4:
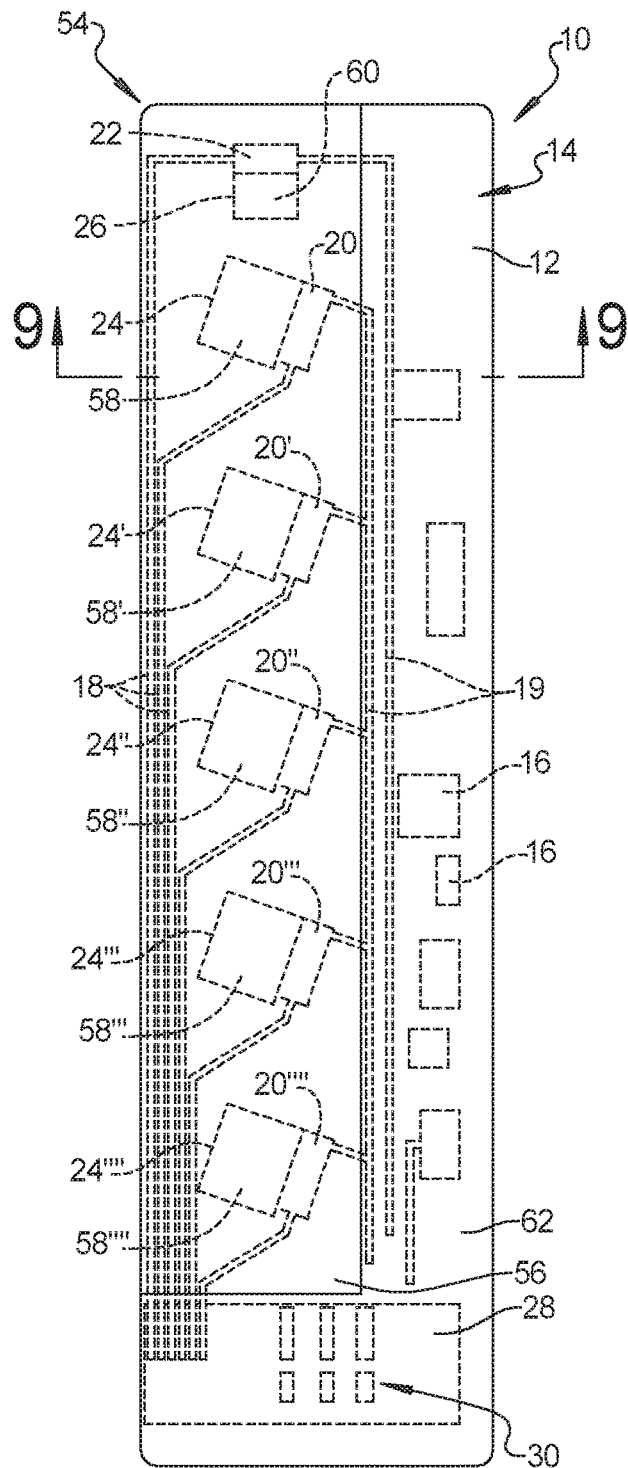
FIG. 4 is a top plan view of a laminated light guide and component carrier according to another embodiment.

Referring to FIG. 5 and again to FIGS. 3 and 4, according to several aspects a laminated light guide and component carrier 64 is modified from the laminated light guide and component carrier 10. A portion of the first side or face 14 of the molded body 12 is overmolded with an optically clear first polymeric material such as thermoplastic polyamide material applied using the low pressure injection molding (LPM) process described in reference to FIG. 4 except at the multiple electronic components 16, the first electrical traces 18, 19 and at the area of the connector 28. The LPM applied optically clear material creates a light guide 66, and according to several aspects, the material of the light guide 66 may be a hot-melt adhesive such as Henkel Technomelt PA 668 provided by the Henkel Corporation, Bridgewater, N.J. The material of the light guide 66 also extends into and fills each of the through apertures 24, 24', 24", 24''', 24'''', 26, which creates an individual light reflector 68, 68', 68", 68''', 68'''' in the through apertures 24, 24', 24", 24''', 24'''' and creates a light reflector 70 in the through aperture 26. Each of the light reflectors 68, 68', 68", 68''', 68'''', 70 can include an area of the light guide 66 having a "pebbled", texturally modified area or geometry proximate to each of the light emitting diodes 20, 20', 20", 20''', 20'''', 22.

Referring to FIG. 6 and again to FIGS. 1 through 5, a laminated light guide and component carrier 72 is modified from the laminated light guide and component carrier 10. A portion of the first side or face 14 of the molded body 12 is overmolded with an optically clear first polymeric material such as thermoplastic polyamide material applied using the low pressure injection molding (LPM) process described in reference to FIG. 4 except at the multiple electronic components 16, the first electrical traces 18, 19 and at the area of the connector 28. The thermoplastic polyamide material creates a light guide 74. The polymeric material of the light guide 74 also extends into and fills each of the through apertures 24, 24', 24", 24''', 24'''', 26, which creates an individual light reflector 76, 76', 76", 76''', 76'''' in the through apertures 24, 24', 24", 24''', 24'''' and creates a light reflector 78 in the through aperture 26. Each of the light reflectors 76, 76', 76", 76''', 76'''', 78 can include an area of the light guide 74 having a "pebbled", texturally modified area or geometry proximate to each of the light emitting diodes 20, 20', 20", 20''', 20'''', 22.

Figure 5:
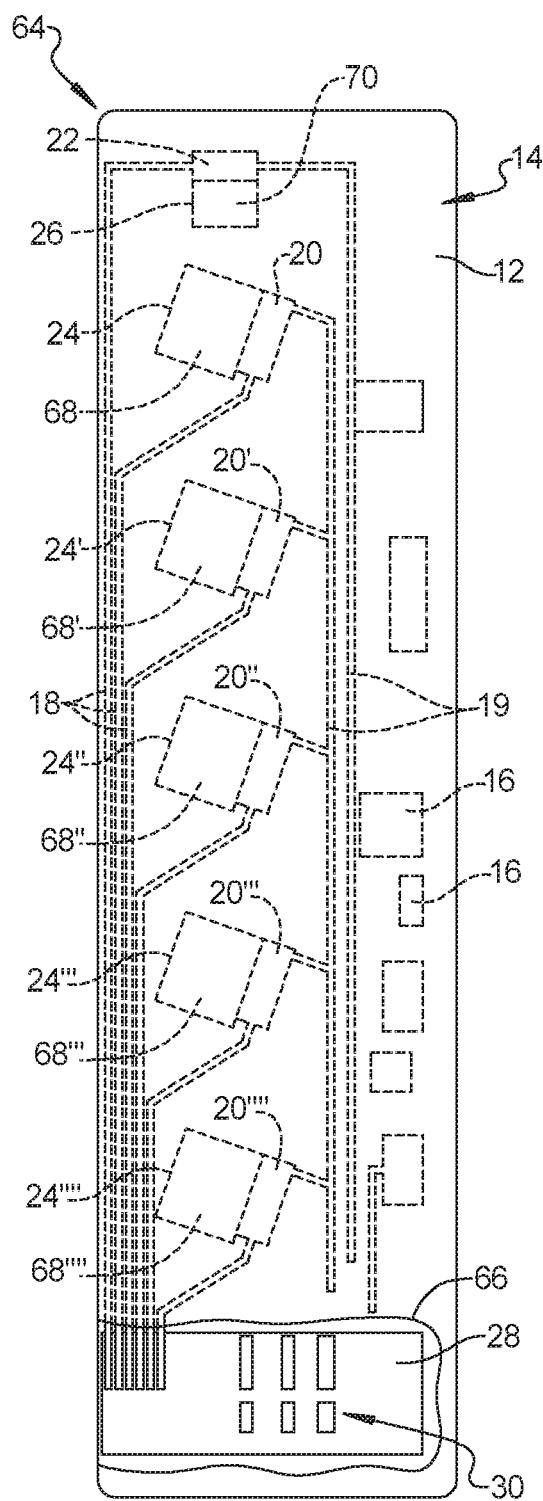
FIG. 5 is a top plan view of a laminated light guide and component carrier according to another embodiment.

Some or all of the remaining components and surface area of the first side or face 14 of the molded body 12 including the multiple electronic components 16, the first electrical traces 18, 19 and the area of the connector 28 are overmolded with a second, optionally opaque polymeric material such as a thermoplastic polyamide material applied using the low pressure injection molding (LPM) process described in reference to FIG. 5 to create a coating layer 80. The coating layer 80 provides environmental protection for the multiple electronic components 16, the first electrical traces 18, 19 and the area of the connector 28, and may be black in color to visibly distinguish the coating layer 80 from the optically clear light guide 74. Opaque is herein defined as a material having limited or no capability to transmit light therethrough. In contrast, optically clear is herein defined as a material having limited or no resistance to the transmission of light therethrough. The optically clear light guide 74 and the coating layer 80 applied using the low pressure molding process can have the same or different thicknesses. Both the optically clear light guide 74 and the coating layer 80 applied using the low pressure molding process have certain areas (localized) that may be thicker to cover taller electrical components. Material applied using the low pressure molding process can have a topography shape over the electrical components selected to minimize usage of the more expensive resin and to allow space for the final injection of an acrylonitrile butadiene styrene (ABS) polymeric layer over the molded body 12 acting as a protective coating.

Figure 7:
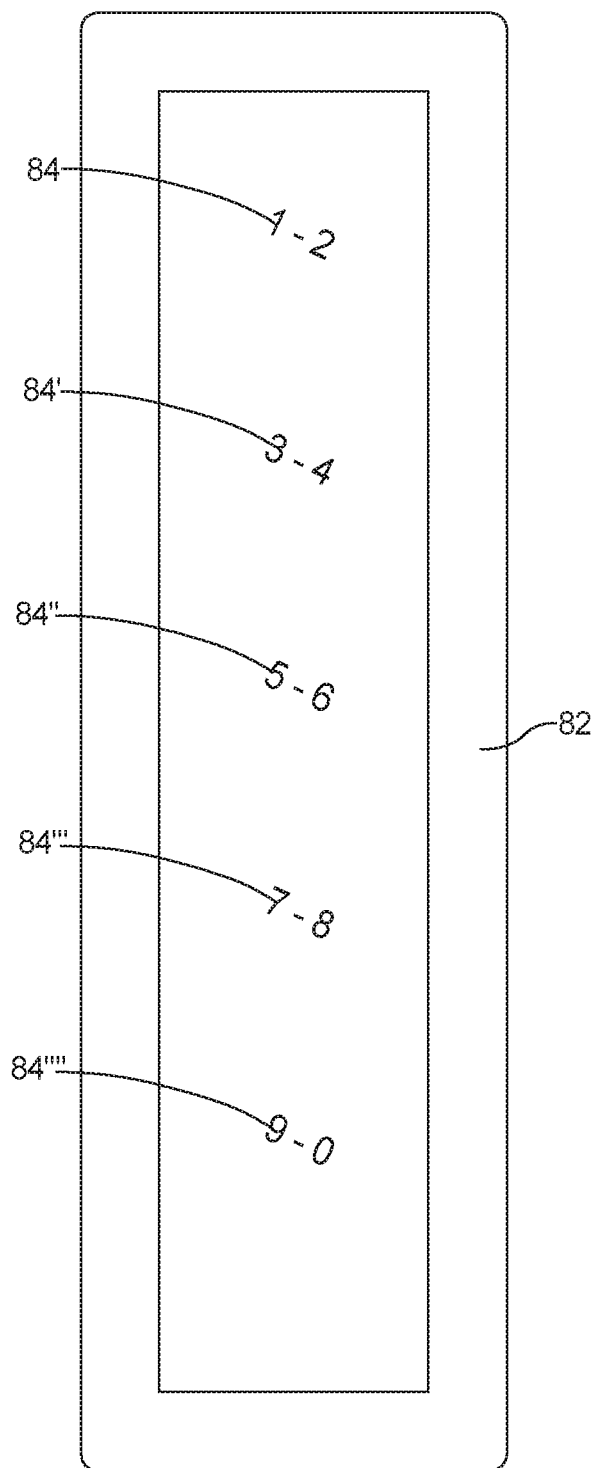
FIG. 7 is a plan view of an opaque film for application onto the laminated light guide and component carrier of FIG. 2.

Referring to FIG. 7 and again to FIGS. 1 and 2, a polymeric substantially opaque film 82 is applied for example by adhesive bonding to the second face 32 including onto the capacitive touch circuits 34, the electrical traces 36, the capacitive touch sensors 38, and the electrical traces 39. According to several aspects, the opaque film 82 is black in color. Light generated by any of the light emitting diodes 20, 20', 20", 20''', 20'''', 22 of the molded body 12 is blocked from passing through the opaque film 82 except at individual locations of multiple indicia 84, 84', 84", 84''', 84''''. The indicia 84, 84', 84", 84', 84'''' are light transparent portions of the opaque film 82, and are each individually aligned with one of the window regions 40, 40', 40", 40''', 40'''', 42 where maximum light enhancement is achieved by the light reflectors.

Referring to FIG. 8 and again to FIGS. 1 through 3, all of the electronic components 16, 30, 34 and 38, the connector 28, the light emitting diodes 20, 20', 20", 20''', 20'''', 22 and the electrical traces 18, 19, 36 and 39 are supported directly on or directly by the molded body 12. According to several aspects, a total thickness 86 of the laminated light guide and component carrier 10 may be approximately 2.0 mm, which maximizes the flexibility of the laminated light guide and component carrier 10. The laminated light guide and component carrier 10 can then be placed in an injection mold for subsequent placement of additional layers of protective or decorative polymeric films, or for inclusion of the laminated light guide and component carrier 10 for example into a pillar assembly of an automobile vehicle.

With continuing reference to FIGS. 3 through 6, according to several aspects, the one or more polymeric materials used as the light guide 48, the light guide 56, the coating layer 62, the light guide 66, the light guide 74 and the coating layer 80 used alone or in combination can substantially cover a majority of the first face 14 of the body 12, with small areas left uncovered as desired. For example, the one or more polymeric materials may not cover a portion of the first face of the body 12 to allow the body 12 to be held in a mold (not shown) while applying the polymeric materials, including a portion of a periphery of the body 12 (with the body 12 being held by a mold edge) and areas spaced in a central area of the body 12, where the body 12 may be held in the mold for example by pins.

Figure 9:
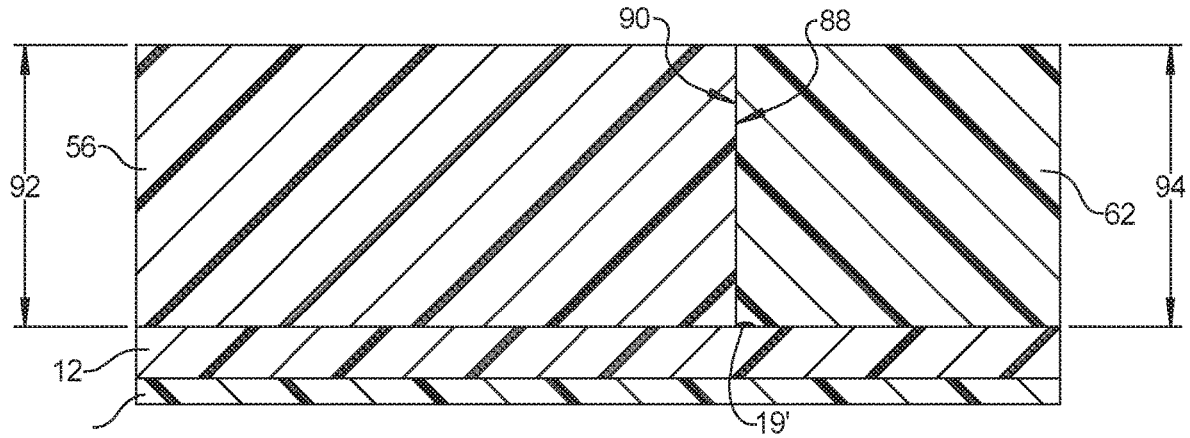
FIG. 9 is a cross sectional end elevational view taken at section 9 of FIG. 4.

Referring to FIG. 9 and again to FIGS. 1 through 4, According to several aspects, the light guide 56 and the opaque polymeric material coating layer 62 directly contact each other at a commonly facing side or first edge 88 of the light guide 56 and an oppositely facing second edge 90 of the opaque polymeric material coating 62. According to several aspects, the first edge 88 and the second edge 90 are generally straight or parallel. According to several aspects, the first edge 88 is aligned with an electrical trace 19'. According to several aspects, the first edge 88 and the second edge 90 are oriented generally perpendicular to the body 12. According to several aspects, a thickness 92 of the material of the light guide 56 and a thickness 94 of the material of the opaque polymeric material coating layer 62 may be equal or be different thicknesses.

Figure 6:
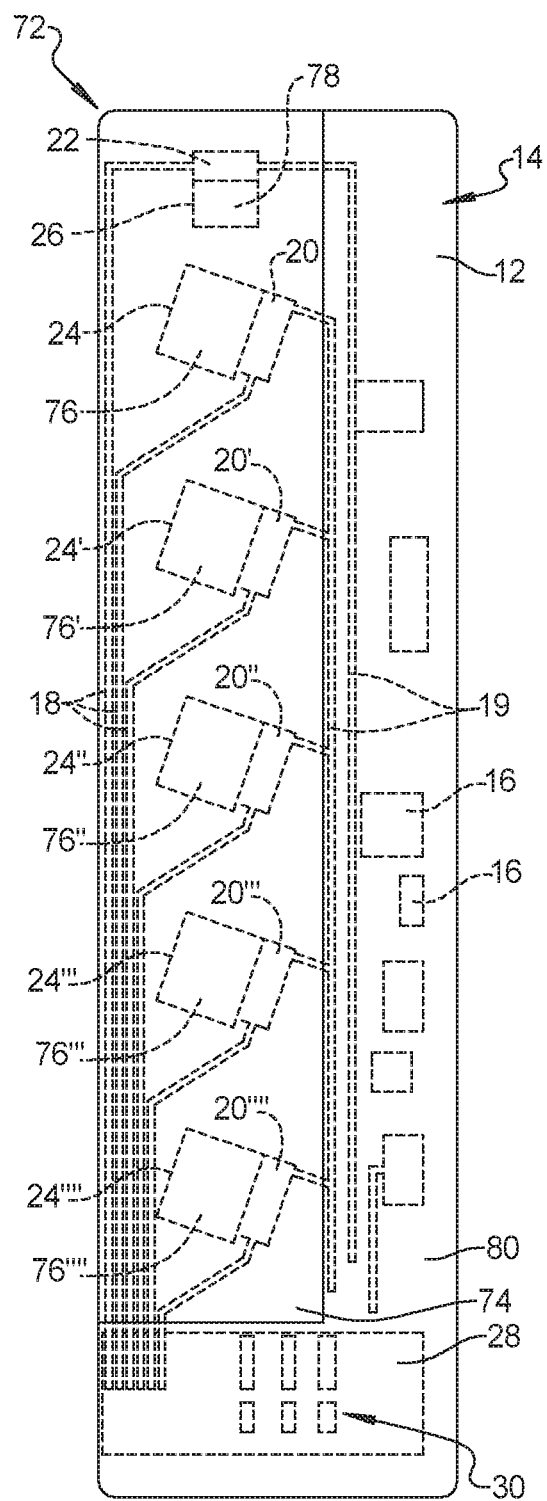
FIG. 6 is a top plan view of a laminated light guide and component carrier according to another embodiment.

Referring to FIG. 10 and again to FIGS. 1 through 6, a laminated light guide and component carrier 96 is modified from the laminated light guide and component carrier 10 described in reference to FIGS. 4 and 6, therefore only the differences with be further discussed herein. The light guide molded body 12 has a light guide 98 overmolded thereon. The light guide 98 is modified from the light guides 56 and 74 such that a first edge 100 of the light guide 98 aligns with an outer edge 102 of the molded body 12. The material of the light guide 98 covers each of the light emitting diodes 20, 20', 20", 20''', 20'''', 22, and extends into and fills each of the through apertures 24, 24', 24", 24''', 24'''', 26, which creates an individual light reflector 50, 50', 50", 50''', 50'''' in the through apertures 24, 24', 24", 24''', 24'''' and creates a light reflector 104 in the through aperture 26. Material of the light guide 98 is omitted from the areas having the electronic components 16, therefore the light guide 98 has a non-linear or sawtooth-shaped second edge 106 facing or directed toward the electronic components 16 so the second edge 106 steps around the electronic components 16 as necessary to avoid covering the electronics components 16. The light guide 98 can be overmolded using the optically clear PMMA material of the light guide 56 previously described herein, or using the optically clear LPM hot melt material similar to the light guide 74 previously described herein.

Figure 10:
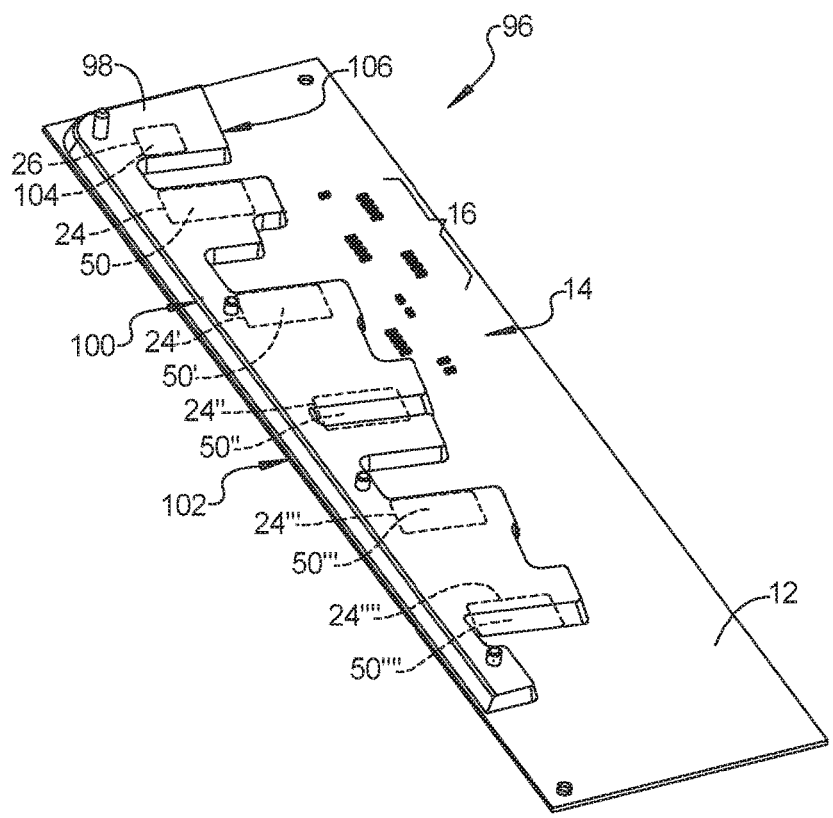
FIG. 10 is a top perspective view of a laminated light guide and component carrier according to another embodiment.

Referring to FIG. 11 and again to FIG. 10, a light guide 108 is modified from the light guide 98 to permit the light guide 108 to be pre-molded and snap-fit or otherwise mechanically connected to the molded body 12. The light guide 108 includes multiple pins 110, 110', 110'', 110''' each located to align with and be frictionally received in one of multiple pin receiving apertures 112, 112', 112'', 112''' created in the molded body 12'. The light guide 108 includes a first edge 100' similar to the first edge 100 that aligns with an outer edge 102' of the molded body 12'. The light guide 108 further includes a non-linear or sawtooth-shaped second edge 106' facing the electronic components 16 as necessary to avoid the electronics components 16 and functions similar to the light guide 98.

Referring to FIG. 12 and again to FIGS. 10 and 11, after overmolding the light guide 98 or after mechanical connection of the light guide 108, a thermoplastic polyamide material is applied using the low pressure injection molding (LPM) process previously described herein to create a coating layer 114 similar to the coating layers 62, 80. The material of the coating layer 114 flows up against and directly contacts the non-linear or sawtooth-shaped second edge 106, 106' facing the electronic components 16, and substantially covers the electronic components 16 to complete the laminated light guide and component carrier 96, 96'.

A laminated light guide and component carrier of the present disclosure offers several advantages. These include provision of a protective over-molding of electronics and molding of an optically clear feature for the transmittance of light. The over-molding applications provide environmental protection, compatible thermal expansion/contraction of the system components and an integrated light guide. The various aspects utilize optically clear resins such as PMMA and low pressure molding (LPM) clear resins and opaque resins where required to protect the electrical components including light emitting diodes while allowing light transmittance. According to several aspects, an opaque LPM resin is over molded over the electrical components for environmental protection. The use of dual resins provides the advantage of providing the correct material performance requirements for over molding of the sensitive electronic components while also providing the best optical requirements for a light guide feature.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A laminated light guide and component carrier, comprising:
    a body having a first face;
    a light emitting diode positioned on the first face;
    first electrical traces printed on the first face with the light emitting diode connected to the first electrical traces;
    a connector positioned on the first face also connected to the first electrical traces, wherein the connector includes capacitive touch film contacts provided within a space envelope of the connector;
    a light guide of a light transmissive polymeric material affixed onto the first face proximate to and covering the light emitting diode and omitted from a space envelope containing the connector; and
    an opaque polymeric material coating layer overmolded onto the first face outside of the light guide.

2. The laminated light guide and component carrier of claim 1, wherein the light guide is overmolded using a high pressure molding process.

3. The laminated light guide and component carrier of claim 2, wherein the light guide defines a poly-methyl methacrylate material.

4. The laminated light guide and component carrier of claim 2, wherein the opaque polymeric material coating layer is overmolded using a low pressure molding process.

5. The laminated light guide and component carrier of claim 1, wherein the opaque polymeric material coating layer has a coefficient of thermal expansion compatible with printed circuit board FR4 material.

6. The laminated light guide and component carrier of claim 1, wherein the light guide and the opaque polymeric material coating layer are each overmolded using a low pressure molding process.

7. The laminated light guide and component carrier of claim 6, wherein the light guide and the opaque polymeric material coating layer individually define a thermoplastic material heated to create a hot-melt prior to molding using the low pressure molding process.

8. The laminated light guide and component carrier of claim 1, further including second electrical traces printed on a second face of the body oppositely directed with respect to the first face.

9. The laminated light guide and component carrier of claim 8, further including capacitive touch circuits printed on the second face of the body.

10. The laminated light guide and component carrier of claim 9, further including capacitive touch second electrical traces connected to the capacitive touch circuits, wherein the second electrical traces are further connected by vias extending through the body to the connector positioned on the first face.

11. A laminated light guide and component carrier, comprising:
    a polymeric material body having a first face;
    a light emitting diode positioned on the first face;
    a connector positioned on the first face;
    a through aperture created in the body positioned proximate to the light emitting diode;
    a light guide of a light transmissive polymeric material affixed onto the first face proximate to and covering the light emitting diode and filling the through aperture, and omitted from a space envelope containing the connector; and
    an opaque polymeric material coating layer overmolded onto the first face outside of the light guide.

12. The laminated light guide and component carrier of claim 11, further including first electrical traces printed on the first face with the light emitting diodes each connected to the first electrical traces.

13. The laminated light guide and component carrier of claim 12, further including capacitive touch circuits printed on a second face of the body wherein the connector is also connected to the first electrical traces and the capacitive touch circuits.

14. The laminated light guide and component carrier of claim 11, wherein the light guide is applied using a high pressure molding process.

15. The laminated light guide and component carrier of claim 11, wherein the light guide is applied using a low pressure molding process.

16. The laminated light guide and component carrier of claim 11, wherein the light guide and the opaque polymeric material coating layer are each overmolded using a low pressure molding process, and each define a thermoplastic material heated to create a hot-melt prior to molding using the low pressure molding process.

17. The laminated light guide and component carrier of claim 16, wherein:
the light guide and the opaque polymeric material coating layer directly contact each other at a commonly facing edge of each of light guide and the opaque polymeric material coating layer; and
the light guide and the opaque polymeric material coating layer have substantially a same thickness.

18. The laminated light guide and component carrier of claim 11, further including multiple electronic components mounted on the first face, wherein the light guide is omitted from covering the electronic components.

19. The laminated light guide and component carrier of claim 18, wherein the light guide includes a non-linear sawtooth-shaped face directed toward the electronic components.

20. The laminated light guide and component carrier of claim 18, wherein the light guide includes a pin frictionally received in an aperture created in the body to mechanically couple the light guide to the body.

21. A laminated light guide and component carrier, comprising:
a polymeric material body having a first face and an oppositely directed second face;
multiple light emitting diodes positioned on the first face;
a connector positioned on the first face;
multiple individual through apertures created in the body each positioned proximate to one of the light emitting diodes;
a light guide of a light transmissive polymeric material affixed onto at least all of the light emitting diodes and filling each of the multiple individual through apertures, the light transmissive polymeric material omitted from a space envelope containing the connector;
an opaque polymeric material coating layer overmolded onto the first face outside of the light guide; and
a polymeric substantially opaque film applied to the second face, wherein light generated by any of the light emitting diodes is blocked from passing through the opaque film except at individual locations of indicia defining light transmissive portions of the opaque film each individually aligned with one of the through apertures.

22. The laminated light guide and component carrier of claim 21, wherein:
the light transmissive polymeric material of the light guide defines a poly-methyl methacrylate material overmolded using a high pressure molding process; and
the opaque polymeric material coating layer defines a thermoplastic material overmolded using a low pressure molding process.

23. The laminated light guide and component carrier of claim 21, wherein the light guide and the opaque polymeric material coating layer are each overmolded using a low pressure molding process, and each define a thermoplastic material heated to create a hot-melt prior to molding using the low pressure molding process.

24. The laminated light guide and component carrier of claim 21, further including multiple electronic components positioned on the first face and electrically connected to a plurality of first electrical traces printed onto the first face, the multiple electronic components and the first electrical traces covered by the opaque polymeric material coating layer.

25. The laminated light guide and component carrier of claim 21, wherein the light guide and the opaque polymeric material coating layer directly contact each other at a commonly facing first edge of light guide and a second edge of the opaque polymeric material coating layer, the first edge and the second edge oriented substantially perpendicular with respect to the body.

26. The laminated light guide and component carrier of claim 25, wherein the first edge is aligned with an electrical trace positioned on the first face of the body.

27. The laminated light guide and component carrier of claim 21, wherein the light guide and the opaque polymeric material coating layer have substantially a same thickness.

* * * * *